United States Patent
Chao et al.

(10) Patent No.: US 7,417,279 B2
(45) Date of Patent: Aug. 26, 2008

(54) EEPROM AND METHOD OF MANUFACTURING THE SAME

(75) Inventors: Chih-Wei Chao, Taipei (TW); Chin-Wei Hu, Hsinchu (TW); Chi-Wen Chen, Chia Yi Hsien (TW)

(73) Assignee: AU Optronics Corp., Hsinchu (TW)

( * ) Notice: Subject to any disclaimer, the term of this patent is extended or adjusted under 35 U.S.C. 154(b) by 239 days.

(21) Appl. No.: 11/205,108

(22) Filed: Aug. 17, 2005

(65) Prior Publication Data
US 2006/0237765 A1   Oct. 26, 2006

(30) Foreign Application Priority Data
Apr. 22, 2005   (TW) ............... 94112910 A

(51) Int. Cl.
*H01L 29/94* (2006.01)
(52) U.S. Cl. ................... 257/315; 257/314
(58) Field of Classification Search .......... 257/314, 257/315
See application file for complete search history.

(56) References Cited

U.S. PATENT DOCUMENTS

| | | | | | |
|---|---|---|---|---|---|
| 4,233,616 | A | * | 11/1980 | Kyomasu et al. | 257/315 |
| 5,465,231 | A | * | 11/1995 | Ohsaki | 365/185.33 |
| 5,998,830 | A | * | 12/1999 | Kwon | 257/315 |
| 6,005,270 | A | | 12/1999 | Noguchi | 257/315 |

* cited by examiner

*Primary Examiner*—Douglas M Menz
(74) *Attorney, Agent, or Firm*—Troxell Law Office, PLLC

(57) ABSTRACT

An EEPROM includes a substrate, a first semiconductor layer and a second semiconductor layer formed on the substrate. The first semiconductor layer is isolated from the second semiconductor layer by a trench. A first source and a first drain are located at two opposing sides of the first semiconductor layer. A first dielectric layer is formed on the first semiconductor layer, and a first floating gate is formed on the first dielectric layer. A second source and a second drain are located at two opposing sides of the second semiconductor layer. A second dielectric layer is formed on the second semiconductor layer, and a second floating gate is formed on the second dielectric layer. The first floating gate and the second floating gate are electrically connected.

15 Claims, 8 Drawing Sheets

EEPROM AND METHOD OF MANUFACTURING THE SAME

This application claims the benefit of Taiwan application Serial No. 094112910, filed Apr. 15, 2005.

BACKGROUND OF THE INVENTION (1) Field of the Invention

The invention relates to an electrically erasable programmable read only memory (EEPROM) and a method for producing the EEPROM, and more particularly to the EEPROM that is formed on a substrate.

(2) Description of the Related Art

An electrically erasable programmable read only memory (EEPROM), widely seen in various electronic products, is characterized in capability of storing data under a no-source environment, fast accessing, larger capacity, and a small size.

Referring to FIG. 1, an EEPROM structure disclosed in U.S. Pat. No. 5,998,830 is schematically shown. The EEPROM 1 as shown is a single-poly silicon formed on insulator (SOI) structure.

The single-poly silicon EEPROM 1 mainly uses two neighboring metal oxide semiconductors (MOS), the first MOS 11 and the second MOS 12, as the memory cells. To avoid possible "latch up" between the first MOS 11 and the second MOS 12, the MOSes 11 and 12 are then form on a SOI 13. As shown, the SOI 13, formed on a silicon substrate 14, includes an insulator layer 131, generally a silicon oxide, and a silicon layer 132. The silicon layer 132 is isolated from the silicon substrate 141 by the insulator layer 131.

As shown in FIG. 1, each of the MOSes 11 and 12 has a gate 110 or 120, a drain 111 or 121, a source 112 or 122, respectively. The drain 111 of the first MOS 11 is electrically connected with a bit line $V_D$, the source 112 is connected to grounded Vs, and the gate 110 as a floating gate of the EEPROM 1 is electrically connected to the gate 120 of the second MOS 12. The drain 121 and the source 122 of the second MOS 12 are coupled to a control gate of the EEPROM 1 for receiving a control voltage Vg.

In operating the EEPROM 1, different control voltages Vg are utilized to determine the "tunneling" of thermal electrons to the floating gate. In the case that electrons enter the floating gate, the memory cell of the EEPROM 1 will be set at a value "1". On the other hand, in the case that the electrons escape from the floating gate, the memory cell of the EEPROM 1 will be set at a value "0". Without altering the control voltage Vg, the information or data stored into the memory cell will be maintained even that no power is present.

Though the EEPROM 1 has many advantages as described above and is also widely accepted in various electronic products, yet current application that the electric connection between the glass substrate 2 and the EEPROM 1 via the flexible printed circuit board 22 requires the EEPROM 1 to be mounted on a printed circuit board 21 in advance, as shown in FIG. 2. For the EEPROM 1 is formed exterior to the glass substrate 2, packing cost to include the EEPROM 1 and the flexible printed circuit board 21 would be increased and also the whole package including the glass substrate 2 would be big and thick.

It is noted that the improvement to form the EEPROM directly onto the glass substrate can reduce the packing cost of the EEPROM, waive the flexible printed circuit board, thus increase the speed of data accessing, and reduce the reaction time of image processing.

SUMMARY OF THE INVENTION

Accordingly, it is an object of the present invention to form an EEPROM structure directly on a substrate without a "latch up" between neighboring MOS elements.

It is another object of the present invention to provide an EEPROM structure formed on a glass substrate by which the rate of the data accessing can be increased and the reaction time of the image processing can be reduced.

It is one more object of the present invention to provide a method for forming the EEPROM on a glass substrate.

In accordance with the present invention, a single-poly silicon EEPROM structure formed on a substrate includes the substrate, a first semiconductor, a second semiconductor, a first floating gate, and a second floating gate.

The substrate can be a silicon substrate or a glass substrate. In the case that the substrate is made of glass, a plurality of display elements in an array arrangement can be included inside the glass substrate. The first semiconductor and the second semiconductor are both formed on the substrate, but spaced by a trench. A first dielectric layer is formed on the top of the first semiconductor, and the first floating gate is then formed on the first dielectric layer. The first dielectric layer can be an insulator layer, generally including a silicon oxide. The first floating gate can be made of a poly silicon or a metal. Further, two lateral ends of the first semiconductor under the first floating gate are ion-doped to form respective $N^+$-type ion-doped regions. One of the ion-doped regions is a first source region, generally grounded to Vs, while another is a first drain region coupled to a bit line Vs.

Similarly, a second dielectric layer is formed on the top of the second semiconductor, and the second floating gate is then formed on the second dielectric layer. The first dielectric layer and the second dielectric layer can be different portions of the same layer and can be made of the same material. Also, the first floating gate and the second floating gate can be different portions of the same layer and can be made of the same material. The first floating gate and the second floating gate are electrically connected. The entire of the second semiconductor can be a $N^+$ type ion-doped region, or two lateral ends of the second semiconductor under the second floating gate can be ion-doped to form respective $N^+$-type ion-doped regions. One of the ion-doped regions is a second source electrode region, while another is a second drain electrode region coupled to a bit line $V_D$, and both of which are electrically connected to control gate.

In the present invention, the EEPROM is controlled by giving specific control voltages Vg so as to control the thermal electron "tunneling" between the first semiconductor and the first floating gate. Upon such an arrangement, "write" or "erase" upon the data can be processed.

In addition, the method for forming the EEPROM described above includes steps of: forming a first semiconductor and a separate second semiconductor on a substrate; forming a dielectric layer on both tops of the first semiconductor and the second semiconductor; forming a first floating gate and a separate second floating gate on the top of the dielectric layer; defining a first source region and a first drain region to lateral ends of the first semiconductor under the first floating gate and processing a first ion-doping to the first semiconductor; processing a second ion-doping to the second semiconductor so as to make the second semiconductor have at least an ion-doped region; forming inter-layer dielectric layers on the top of the substrate, the first semiconductor, the second semiconductor, the first floating gate, and the second floating gate respectively; forming respective lead apertures to respective tops of the first floating gate and the second floating gate; and finally, forming a metal layer to the inter-layer dielectric layer and the lead apertures so as to establish electric connection between the first floating gate and the second floating gate.

Preferably, doped ions of the present invention for the first semiconductor and the second semiconductor can be $N^+$ type or $P^+$ type. Each cubic centimeter ($cm^3$) of the doped first semiconductor and the doped second semiconductor contains a number of the doped ions about from $1\times10^{12}$ atoms to $1\times10^{13}$ atoms, preferably from $5\times10^{12}$ atoms to $5\times10^{13}$ atoms. Also, the dielectric layer of the present invention can be formed by a Plasma Enhanced Chemical Vapor Deposition (PECVD).

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an EEPROM and a method of manufacturing the same. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
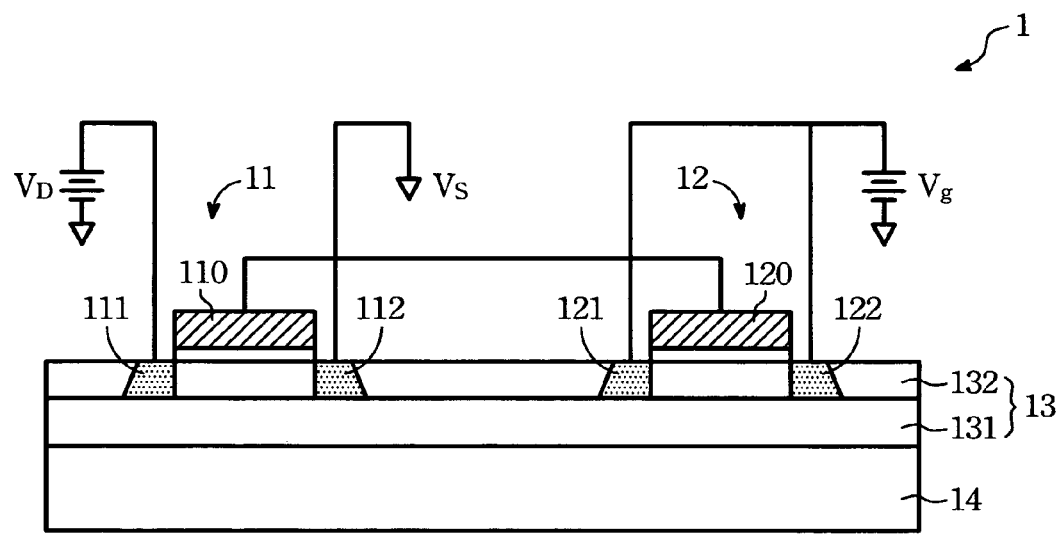
FIG. 1 shows an EEPROM structure of U.S. Pat. No. 5,998,830.
Figure 2:
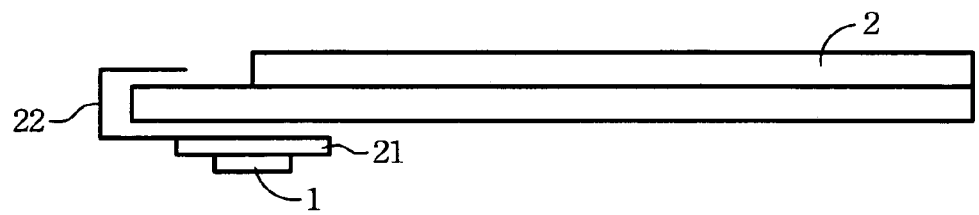
FIG. 2 is a schematic view showing the connection between a conventional EEPROM and the glass substrate.
Figure 3A:
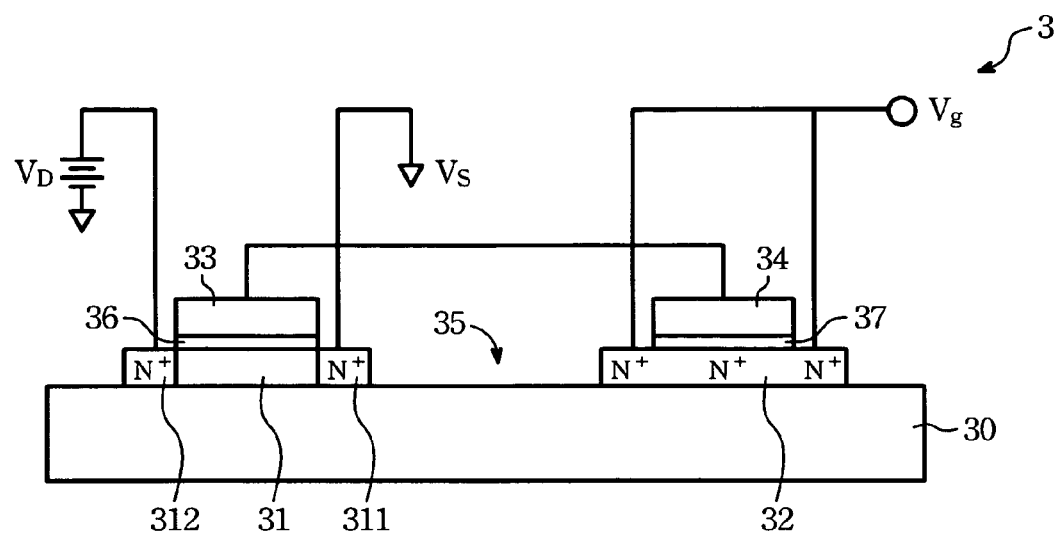
FIG. 3A is a schematic view of an embodiment of the EEPROM in accordance with the present invention.

Referring now to FIG. 3A, the EEPROM structure 3 of the present invention includes a substrate 30, a first semiconductor 31, a second semiconductor 32, a first floating gate 33, and a second floating gate 34.

The substrate 30 used in the present invention can be a silicon substrate or a glass substrate. The first semiconductor 31 and the second semiconductor 32 are both formed on the substrate 30, but spaced by a trench 35. The trench 35 can be form by properly etching. A first dielectric layer 36 is formed on the top of the first semiconductor 31, and the first floating gate 33 is then formed on the first dielectric layer 36. As shown, two lateral ends of the first semiconductor 31 under the first floating gate 33 are ion-doped to form respective $N^+$-type ion-doped regions. One of the ion-doped regions is a first source region 311, generally grounded to Vs, while another is a first drain region 312 coupled to a bit line Vs.

Figure 3B:
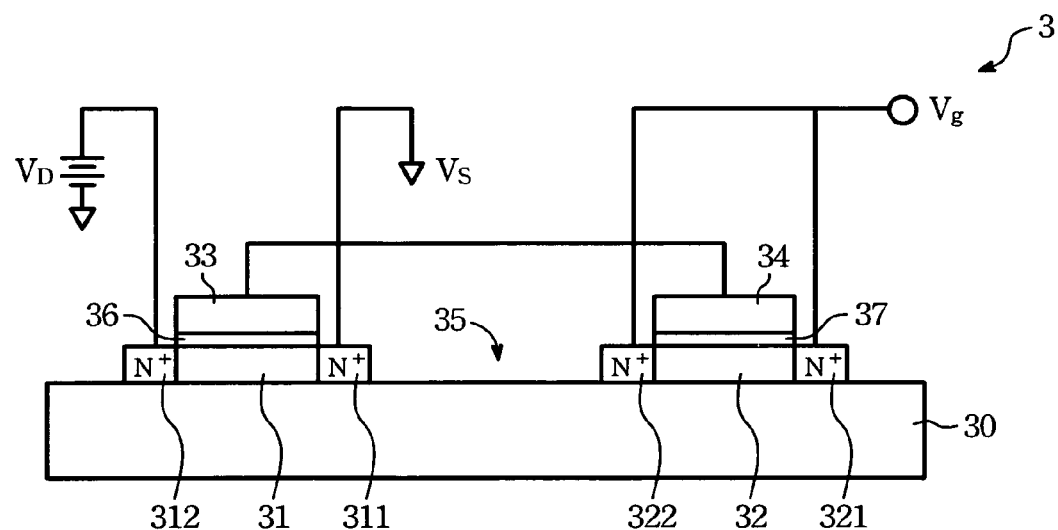
FIG. 3B is a schematic view of another embodiment of the EEPROM in accordance with the present invention.

Similarly, a second dielectric layer 37 is formed on the top of the second semiconductor 32, and the second floating gate 34 is then formed on the second dielectric layer 37. The first floating gate 33 and the second floating gate 34 are electrically connected. The entire of the second semiconductor 32 can be an $N^+$-type ion-doped region as shown in FIG. 3A, or only two lateral ends of the second semiconductor 32 under the second floating gate 34 are ion-doped to form separate $N^+$-type ion-doped regions, the second source region 321 and the second drain region 322 as shown in FIG. 3B. However, any ion-doped region described above is electrically connected to control gate.

The first dielectric layer 36 and the second dielectric layer 37 are both insulator layers, generally including silicon oxide. Material for the first floating gate 33 and the second floating gate 34 is usually poly silicon or metal. The doped ions used in the present invention for the first semiconductor 31 and the second semiconductor 32 can be $N^+$-type ones as described above or $P^+$-type ions. Preferably, each cubic centimeter ($cm^3$) of the doped first semiconductor 31 and the doped second semiconductor 32 contains a number of the doped ions ranged about from $1\times10^{12}$ atoms to $1\times10^{13}$ atoms, in particular, from $5\times10^{12}$ atoms to $5\times10^{13}$ atoms.

In the present invention, the EEPROM is controlled by giving specific control voltages Vg so as to control the thermal electron "tunneling" between the first semiconductor and the first floating gate. Upon such an arrangement, "write" or "erase" operation upon the data can be processed.

Figure 4:
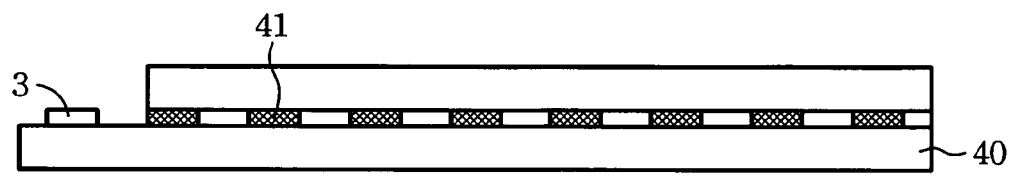
FIG. 4 shows how the EEPROM of the present invention is constructed on a glass substrate.

Referring now to FIG. 4, the EEPROM 3 of the invention is formed on a glass substrate 40, in which a plurality of display elements 41 in an array arrangement can be included inside the glass substrate 40. Compared to the EEPROM shown the one shown in FIG. 3A, the EEPROM 3 of FIG. 4 are formed at a lateral side of the glass substrate 40 (left side shown in the figure).

Figure 5A:
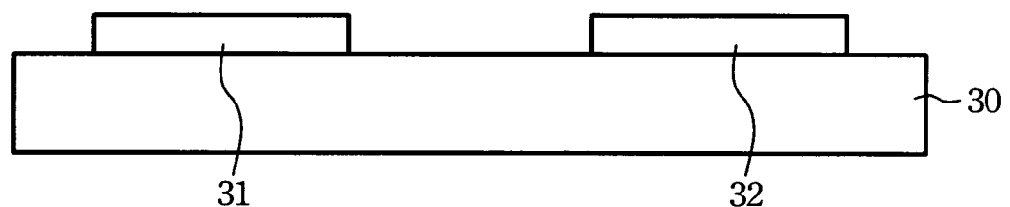
FIG. 5A through FIG. 5H show steps of a first embodiment of the method of manufacturing the EEPROM in accordance with the present invention.
Figure 5B:
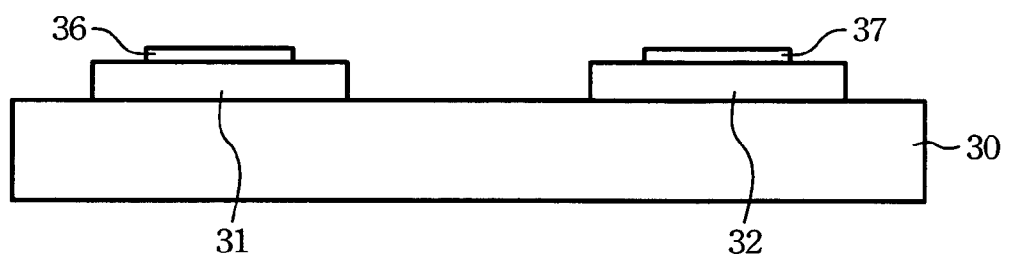
Figure 5C:
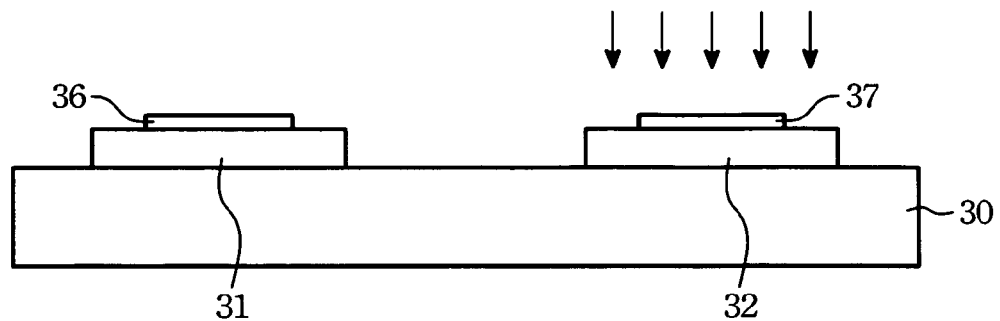
Figure 5D:
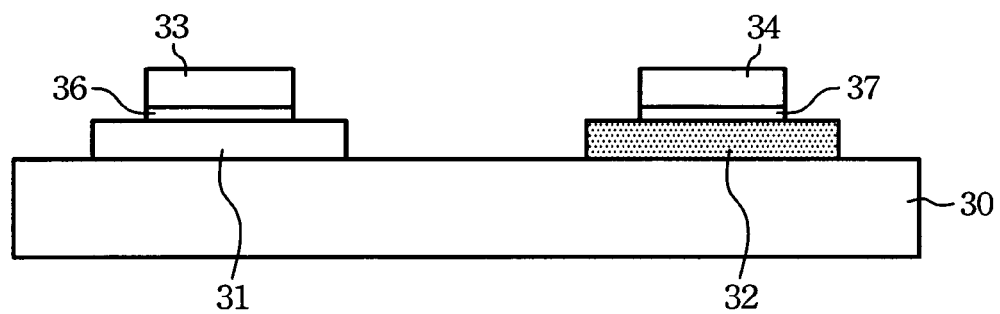
Figure 5E:
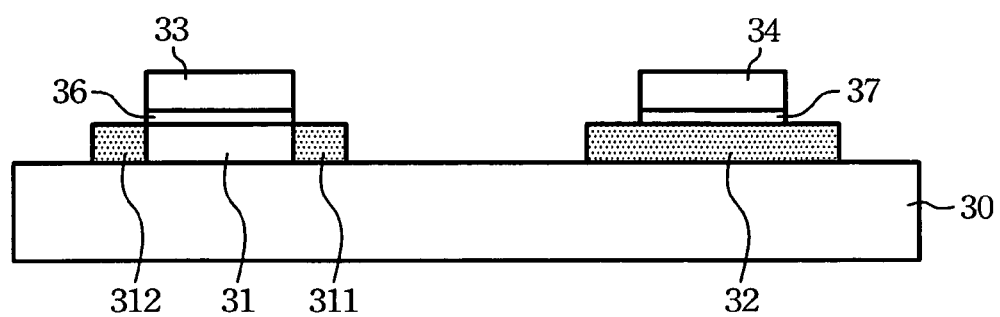
Figure 5F:
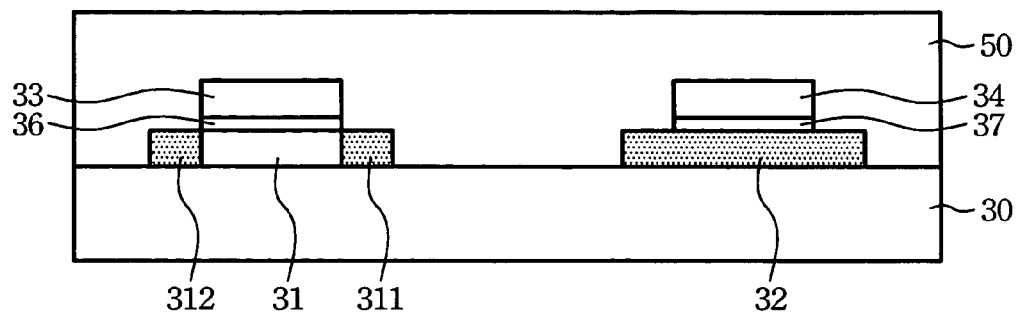
Figure 5G:
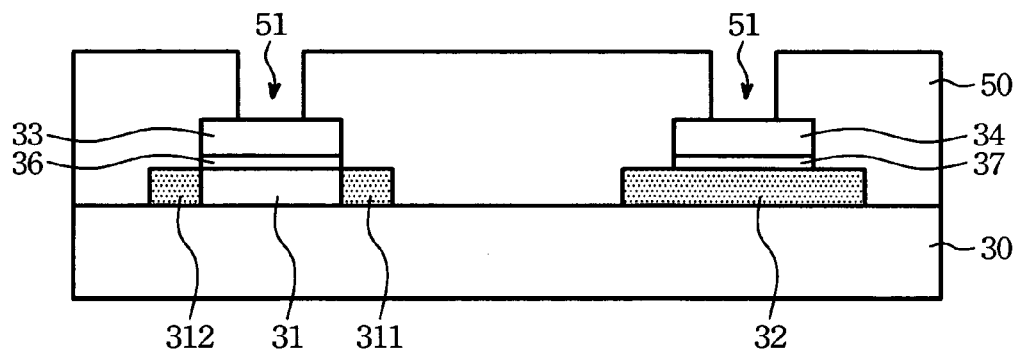
Figure 5H:
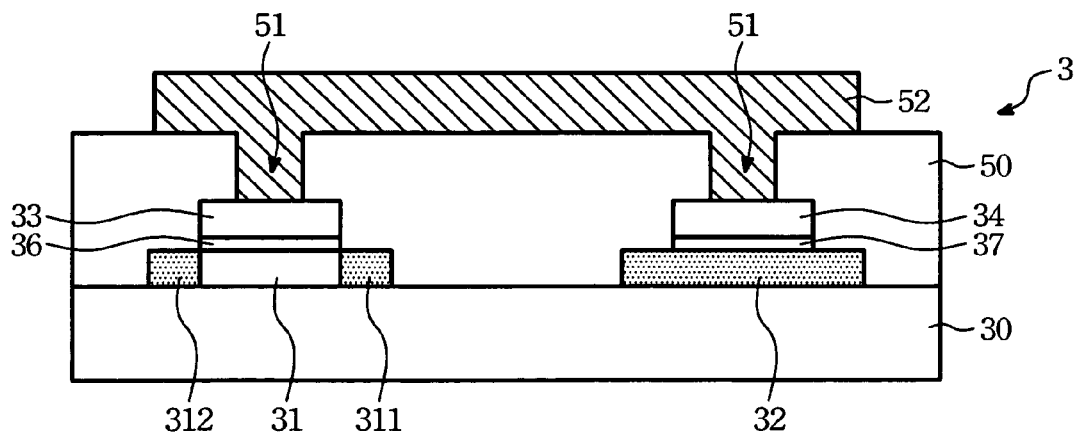

Referring now to FIG. 5A to FIG. 5H, a first embodiment of the method for manufacturing the EEPROM of the present invention is shown step by step. The method for forming the EEPROM described above includes the steps of: firstly forming a first semiconductor 31 and a separate second semiconductor 32 on a substrate 30 (FIG. 5A), wherein the first semiconductor 31 and the second semiconductor can be formed simultaneously; forming a dielectric layer on the tops of the first semiconductor 31 and the second semiconductor 32 and removing a portion of the dielectric layer so as to form a first dielectric layer 36 on the top of the first semiconductor 31 and a second dielectric layer 37 on the top of the second semiconductor 32 (FIG. 5B); ion-doping the entire of second semiconductor 32 (FIG. 5C); forming a first floating gate 33 and a second floating gate 34 on the tops of the first dielectric layer 36 and the second dielectric layer 37, respectively (FIG. 5D), wherein the first floating gate 33 and the second floating gate 34 can be formed simultaneously; defining a first source region 311 and a first drain region 312 to lateral ends of the first semiconductor 31 under the first floating gate 33 and processing a first ion-doping to the first semiconductor, and processing a first ion-doping (FIG. 5E); forming the inter-layer dielectric layer 50 on the tops of the substrate 30, the first semiconductor 31, the second semiconductor 32, the first floating gate 33 and the second floating gate 34 (FIG. 5F); forming lead apertures 51 to respective tops of the first floating gate 33 and the second floating gate 34 (FIG. 5G); and finally, forming a metal layer 52 to the top of the inter-layer dielectric layer 50 and interiors of the lead apertures 51 so as to establish electrically connection between the first floating gate 33 and the second floating gate 34 (FIG. 5H).

In the present invention, the first dielectric layer 36 and the second dielectric layer 37 can be formed by a Plasma Enhanced Chemical Vapor Deposition (PECVD). The doped ions of the present invention for the first semiconductor 31 and the second semiconductor 32 can be $N^+$ type ions or $P^+$ type ions. Each cubic centimeter ($cm^3$) of the doped first semiconductor 31 and the doped second semiconductor 32 contains a number of the doped ions about from $1\times10^{12}$ atoms to $1\times10^{13}$ atoms, preferably from $5\times10^{12}$ atoms to $5\times10^{13}$ atoms.

Figure 6A:
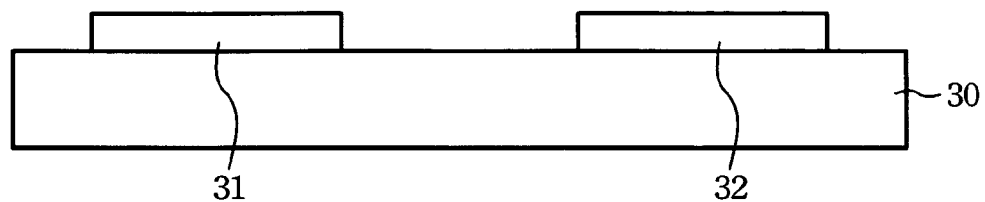
FIG. 6A through FIG. 6H show steps of a second embodiment of the method of manufacturing the EEPROM in accordance with the present invention.
Figure 6B:
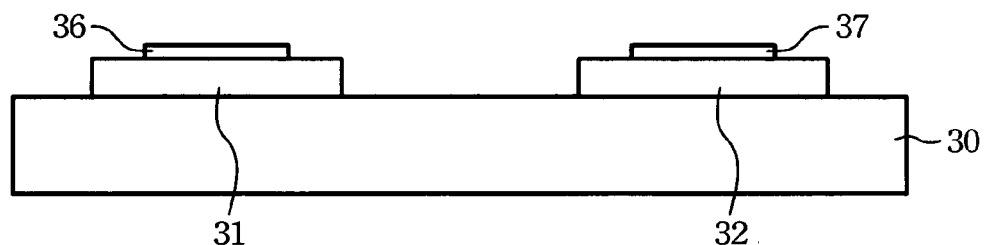
Figure 6C:
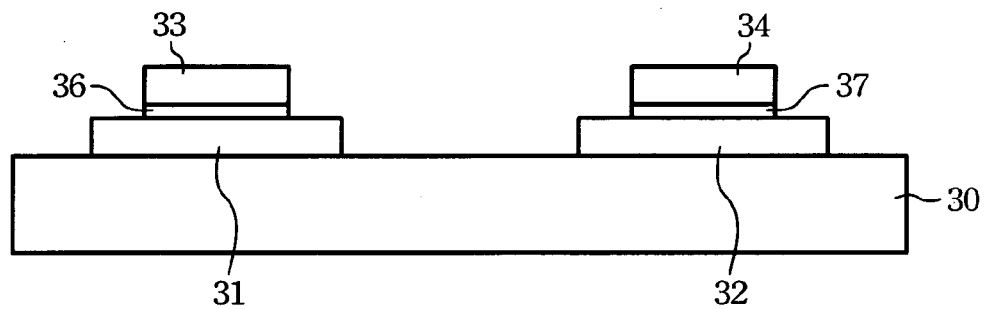
Figure 6D:
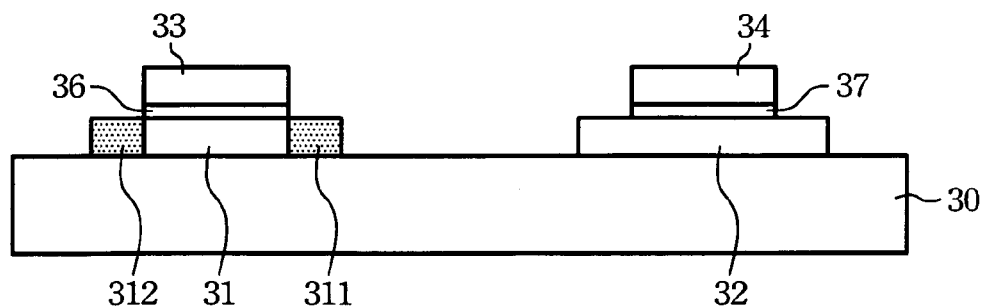
Figure 6E:
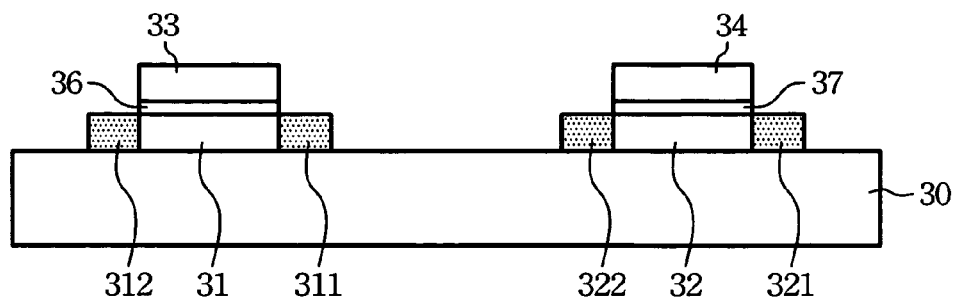
Figure 6F:
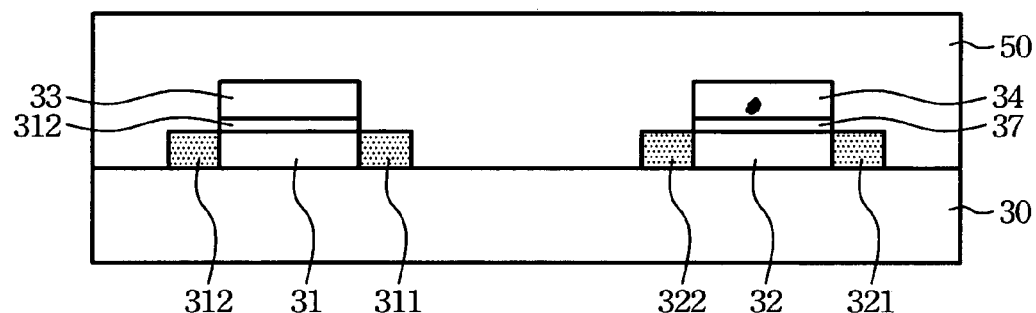
Figure 6G:
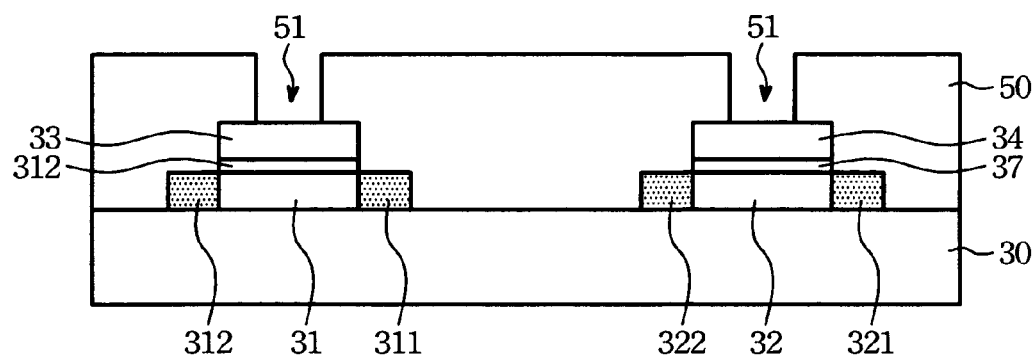
Figure 6H:
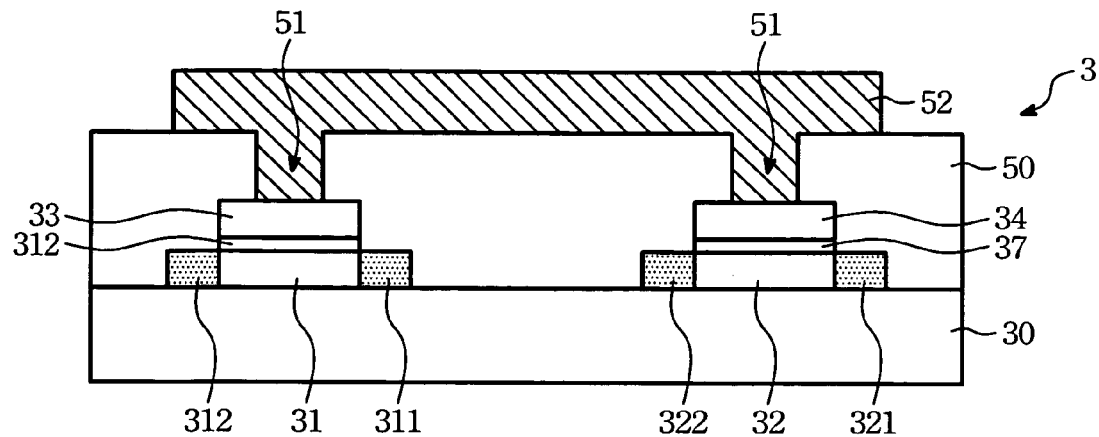

Referring now to FIG. 6A to FIG. 6H, a second embodiment of the method for manufacturing the EEPROM of the present invention is shown step by step. The method for forming the EEPROM described above includes steps of: firstly forming a first semiconductor 31 and a separate second semiconductor 32 on a substrate 30 (FIG. 6A); forming a first dielectric layer 36 on the top of the first semiconductor 31 and a second dielectric layer 37 on the top of the second semiconductor 32 (FIG. 6B); forming a first floating gate 33 and a second floating gate 34 on the tops of the first dielectric layer 36 and the second dielectric layer 37, respectively (FIG. 6C); defining a first source region 311 and a first drain region 312 to lateral ends of the first semiconductor 31 under the first floating gate 33 and processing a first ion-doping to the first semiconductor 31 (FIG. 6D); processing a second ion-doping to the second semiconductor 32 so as to form an ion-doped region (FIG. 6E); forming an inter-layer dielectric layer 50 on the tops of the substrate 30, the first semiconductor 31, the second semiconductor 32, the first floating gate 33 and the second floating gate 34 (FIG. 6F); forming lead apertures 51 to respective tops of the first floating gate 33 and the second floating gate 34 (FIG. 6G); and finally, forming a metal layer 52 to the top of the inter-layer dielectric layer 50 and interiors of the lead apertures 51 so as to establish electrically connection between the first floating gate 33 and the second floating gate 34 (FIG. 6H).

In the present invention, the first dielectric layer 36 and the second dielectric layer 37 can be formed by a Plasma Enhanced Chemical Vapor Deposition (PECVD). The first ion-doping and the second ion-doping of the present invention for the first semiconductor 31 and the second semiconductor 32 can be $N^+$ type ions or $P^+$ type ions, and can be processed simultaneously. Each cubic centimeter ($cm^3$) of the doped first semiconductor 31 and the doped second semiconductor 32 contains a number of the doped ions from about $1\times10^{12}$ atoms to $1\times10^{13}$ atoms, preferably from about $5\times10^{12}$ atoms to $5\times10^{13}$ atoms. In addition, the ion-doped region of FIG. 6E can include a second source region 321 and a second drain region 322 located aside the second floating gate 34.

Figure 7:
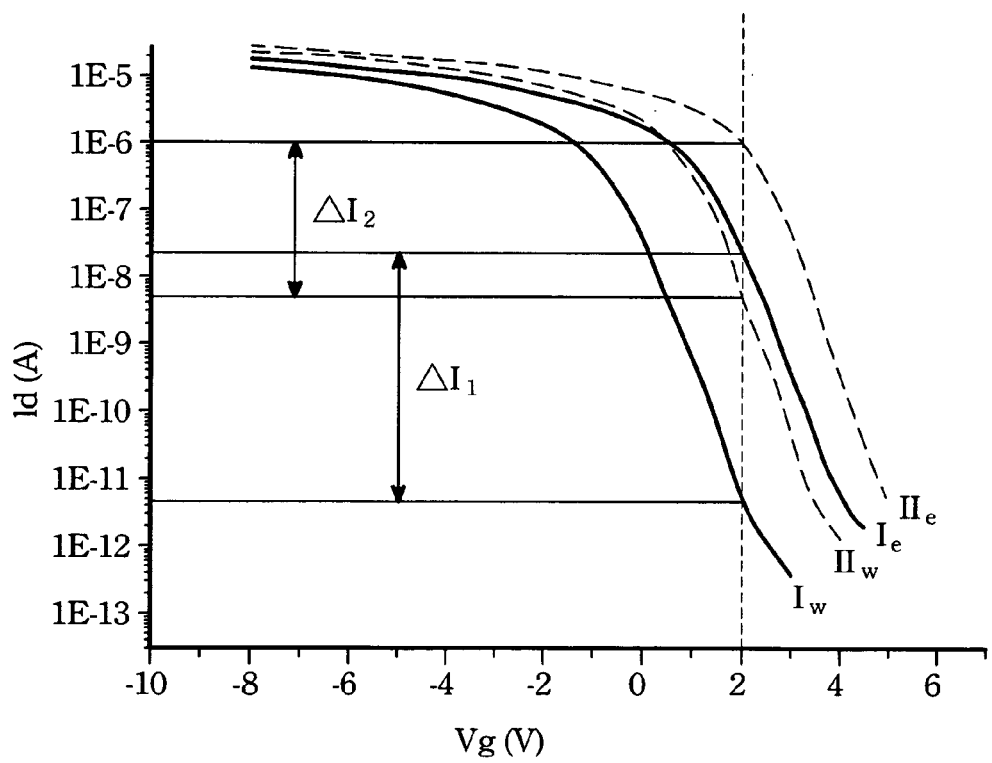
FIG. 7 is an electric test diagram for showing "write" and "erase" of the EEPROM of the present invention under various control voltages Vg.

Referring now to FIG. 7, an electrical test diagram for showing "write" and "erase" of the EEPROM of the present invention under various control voltages Vg is illustrated. In particular, at Vg=2V, $\Delta I_1$ is the current difference between a "write" (Iw) and an "erase" (Ie) in the first embodiment of the EEPROM of the present invention (FIG. 3A), and $\Delta I_2$ is the current difference between a "write" (IIw) and an "erase" (IIe) in the second embodiment of the EEPROM of the present invention (FIG. 3B). For $\Delta I_1 > \Delta I_2$, the rate of data accessing in the first embodiment is greater than that in the second embodiment, and the reaction time in the first embodiment is also smaller (i.e. faster) than that in the second embodiment.

While the present invention has been particularly shown and described with reference to a preferred embodiment, it will be understood by those skilled in the art that various changes in form and detail may be without departing from the spirit and scope of the present invention.

We claim:

1. An electrically erasable programmable read only memory (EEPROM), comprising:
   a substrate;
   a first semiconductor formed on the substrate;
   a second semiconductor formed on the substrate and isolated from the first semiconductor by a trench;
   a first dielectric layer and a second dielectric layer, formed on the first semiconductor and the second semiconductor, respectively;
   a first floating gate formed on the first dielectric layer; and
   a second floating gate formed on the second dielectric layer and electrically connected with the first floating gate.

2. The EEPROM according to claim 1, wherein said first semiconductor includes a first source region and a first drain region, at least one of the first source region and the first drain region being a $N^+$ type ion-doped region.

3. The EEPROM according to claim 2, wherein said second semiconductor includes a second source region and a second drain region, at least one of the second source region and the second drain being a $P^+$ type ion-doped region.

4. The EEPROM according to claim 1, wherein said first semiconductor includes a first source region and a first drain region, at least one of the first source region and the first drain region being a $P^+$ type ion-doped region.

5. The EEPROM according to claim 4, wherein said second semiconductor includes a second source region and a second drain region, at least one of the second source region and the second drain region being a $P^+$ type ion-doped region.

6. The EEPROM according to claim 2, wherein said second semiconductor includes a second source region and a second drain region, at least one of the second source region and the second drain region being a $N^+$ type ion-doped region.

7. The EEPROM according to claim 1, wherein said first dielectric layer and said second dielectric layer include silicon oxide.

8. The EEPROM according to claim 1, wherein said first floating gate includes metal.

9. The EEPROM according to claim 1, wherein said second semiconductor is an ion-doped region.

10. The EEPROM according to claim 9, wherein each cubic centimeter ($cm^3$) of said ion-doped region contains a number of doped ions ranged from about $1\times10^{12}$ atoms to $1\times10^{13}$ atoms.

11. The EEPROM according to claim 9, wherein each cubic centimeter ($cm^3$) of said ion-doped region contains a number of doped ions ranged from about $5\times10^{12}$ atoms to $5\times10^{13}$ atoms.

12. The EEPROM according to claim 9, further comprising a control gate, electrically connected to said second semiconductor, for providing a control voltage.

13. The EEPROM according to claim 12, further comprising a bit line electrically connected to said first drain region.

14. An electrically erasable programmable read only memory (EEPROM), comprising:
    a substrate;
    a first semiconductor, formed on the substrate, having a first source region and a first drain region, wherein at least one of the first source region and the first drain region is a $N^+$ type ion-doped region;
    a second semiconductor formed on the substrate and isolated from the first semiconductor by a trench, wherein the second semiconductor comprises an ion-doped region;
    a first dielectric layer and a second dielectric layer, formed on the first semiconductor and the second semiconductor, respectively;
    a first floating gate formed on the first dielectric layer; and
    a second floating gate formed on the dielectric layer and electrically connected with the first floating gate.

15. The EEPROM according to claim 14, wherein said ion-doped region is a $P^+$ type ion-doped region.

* * * * *